US011257304B2

(12) United States Patent
Melen et al.

(10) Patent No.: US 11,257,304 B2
(45) Date of Patent: Feb. 22, 2022

(54) COOPERATIVE SENSOR ACTIVITY VALIDATION SYSTEM

(71) Applicant: TOYOTA JIDOSHA KABUSHIKI KAISHA, Toyota (JP)

(72) Inventors: Roger Melen, Mountain View, CA (US); Takamasa Higuchi, Mountain View, CA (US); Onur Altintas, Mountain View, CA (US)

( * ) Notice: Subject to any disclaimer, the term of this patent is extended or adjusted under 35 U.S.C. 154(b) by 275 days.

(21) Appl. No.: 16/424,243

(22) Filed: May 28, 2019

(65) Prior Publication Data

US 2020/0380795 A1 Dec. 3, 2020

(51) Int. Cl.
G07C 5/00 (2006.01)
G01C 25/00 (2006.01)
G07C 5/08 (2006.01)
G05D 1/00 (2006.01)

(52) U.S. Cl.
CPC ............. *G07C 5/008* (2013.01); *G01C 25/00* (2013.01); *G05D 1/0055* (2013.01); *G07C 5/0808* (2013.01); *G07C 5/0816* (2013.01); G05D 2201/0213 (2013.01)

(58) Field of Classification Search
CPC .... G07C 5/008; G07C 5/0808; G07C 5/0816; G01C 25/00; G05D 1/0055; G05D 2201/0213; G01R 31/007; G01R 31/2829
See application file for complete search history.

(56) References Cited

U.S. PATENT DOCUMENTS 10,427,655 B2 * 10/2019 Nix .................... G06K 9/00718
2020/0361480 A1 * 11/2020 Rodriguez Bravo . B60W 50/14

* cited by examiner

*Primary Examiner* — Michael V Kerrigan
(74) *Attorney, Agent, or Firm* — Burbage Law, P.C.; Jon-Michael Burbage; Elizabeth Ruzich

(57) ABSTRACT

The disclosure includes embodiments for determining a working status of a set of sensors onboard in a connected vehicle through a validation of roadway segment activity data. In some embodiments, a method for the connected vehicle includes receiving, via a communication unit of the connected vehicle, a Vehicle-to-Everything (V2X) message that includes off-board roadway segment activity data. The method includes generating onboard roadway segment activity data of the connected vehicle. The method includes determining a working status of a set of onboard sensors of the connected vehicle based on an evaluation between the onboard roadway segment activity data and the off-board roadway segment activity data. The method includes modifying an operation of a vehicle control system of the connected vehicle based on the working status of the set of onboard sensors.

20 Claims, 8 Drawing Sheets

COOPERATIVE SENSOR ACTIVITY VALIDATION SYSTEM

BACKGROUND

The specification relates to a cooperative sensor activity validation system. In particular, some embodiments of the specification relate to a cooperative sensor activity validation system which is operable to determine a working status of a set of sensors onboard a vehicle by validating the accuracy of roadway segment activity data.

As automated driving applications such as Advanced Driver Assistance Systems (ADAS systems) become increasingly popular, vehicles tend to be manufactured so that they include an increasing number of onboard sensors. It is a goal in automotive design that these sensors provide accurate data that accurately describes the environment in which the vehicle and the ADAS systems operate.

SUMMARY

One general aspect of embodiments described herein includes a computer program product including a non-transitory memory of an onboard vehicle computer system of a connected vehicle storing computer-executable code that, when executed by a processor, causes the processor to: receive, via a communication unit of the connected vehicle, a Vehicle-to-Everything (V2X) message that includes off-board roadway segment activity data from an external source; generate onboard roadway segment activity data of the connected vehicle; evaluate the onboard roadway segment activity data and the off-board roadway segment activity data to determine an evaluation result; determine a working status of a set of onboard sensors of the connected vehicle based on the evaluation result, where the working status indicates whether a malfunction occurs to the set of onboard sensors; and modify an operation of a vehicle control system of the connected vehicle based on the working status of the set of onboard sensors. Other embodiments of this aspect include corresponding computer systems, apparatus, and computer programs recorded on one or more computer storage devices, each configured to perform the actions of the methods.

Implementations may include one or more of the following features. The computer program product where the computer-executable code, when executed by the processor, causes the processor to evaluate the onboard roadway segment activity data and the off-board roadway segment activity data to determine the evaluation result at least by: comparing the onboard roadway segment activity data with the off-board roadway segment activity data to determine a consistency level; and generating the evaluation result based on the consistency level. The computer program product where the computer-executable code, when executed by the processor, causes the processor to determine the working status of the set of onboard sensors of the connected vehicle based on the evaluation result at least by: determining whether the evaluation result satisfies a malfunction condition; and responsive to determining that the evaluation result satisfies the malfunction condition, determining that the malfunction occurs to the set of onboard sensors. The computer program product where the onboard roadway segment activity data includes activity data describing sensor data generated by the set of onboard sensors and configuration data describing a configuration of the set of onboard sensors. Implementations of the described techniques may include hardware, a method or process, or computer software on a computer-accessible medium.

One general aspect includes a method for a connected vehicle, including: receiving, via a communication unit of the connected vehicle, a V2X message that includes off-board roadway segment activity data; generating onboard roadway segment activity data of the connected vehicle; determining a working status of a set of onboard sensors of the connected vehicle based on an evaluation between the onboard roadway segment activity data and the off-board roadway segment activity data; and modifying an operation of a vehicle control system of the connected vehicle based on the working status of the set of onboard sensors. Other embodiments of this aspect include corresponding computer systems, apparatus, and computer programs recorded on one or more computer storage devices, each configured to perform the actions of the methods.

Implementations may include one or more of the following features. The method where the working status indicates whether a malfunction occurs to the set of onboard sensors of the connected vehicle. The method where the working status further indicates one or more of: a type of the malfunction; and an occurrence likelihood of the malfunction. The method where determining the working status of the set of onboard sensors of the connected vehicle includes: evaluating the onboard roadway segment activity data and the off-board roadway segment activity data to determine an evaluation result; and determining the working status of the set of onboard sensors based on the evaluation result. The method where evaluating the onboard roadway segment activity data and the off-board roadway segment activity data to determine the evaluation result includes: comparing the onboard roadway segment activity data with the off-board roadway segment activity data to determine a consistency level; and generating the evaluation result based on the consistency level. The method where determining the working status of the set of onboard sensors based on the evaluation result includes: determining whether the evaluation result satisfies a malfunction condition; and responsive to determining that the evaluation result satisfies the malfunction condition, determining that a malfunction occurs to the set of onboard sensors. The method further including: providing a warning message responsive to determining that the malfunction occurs to the set of onboard sensors. The method where: the onboard roadway segment activity data includes first activity data describing sensor data generated by the set of onboard sensors and first configuration data describing a configuration of the set of onboard sensors; and the off-board roadway segment activity data includes second activity data that is aggregated and received from a remote server or generated and received from another connected vehicle and second configuration data associated with the second activity data. Implementations of the described techniques may include hardware, a method or process, or computer software on a computer-accessible medium.

One general aspect includes a system including an onboard vehicle computer system of a connected vehicle including a non-transitory memory storing computer code which, when executed by the onboard vehicle computer system, causes the onboard vehicle computer system to: receive, via a communication unit of the connected vehicle, a V2X message that includes off-board roadway segment activity data; generate onboard roadway segment activity data of the connected vehicle; determine a working status of a set of onboard sensors of the connected vehicle based on an evaluation between the onboard roadway segment activity data and the off-board roadway segment activity data;

and modify an operation of a vehicle control system of the connected vehicle based on the working status of the set of onboard sensors. Other embodiments of this aspect include corresponding computer systems, apparatus, and computer programs recorded on one or more computer storage devices, each configured to perform the actions of the methods.

Implementations may include one or more of the following features. The system where the working status indicates whether a malfunction occurs to the set of onboard sensors of the connected vehicle. The system where the working status further indicates one or more of: a type of the malfunction; and an occurrence likelihood of the malfunction. The system where the computer code, when executed by the onboard vehicle computer system, causes the onboard vehicle computer system to determine the working status of the set of onboard sensors of the connected vehicle at least by: evaluating the onboard roadway segment activity data and the off-board roadway segment activity data to determine an evaluation result; and determining the working status of the set of onboard sensors based on the evaluation result. The system where the computer code, when executed by the onboard vehicle computer system, causes the onboard vehicle computer system to evaluate the onboard roadway segment activity data and the off-board roadway segment activity data to determine the evaluation result at least by: comparing the onboard roadway segment activity data with the off-board roadway segment activity data to determine a consistency level; and generating the evaluation result based on the consistency level. The system where the computer code, when executed by the onboard vehicle computer system, causes the onboard vehicle computer system to determine the working status of the set of onboard sensors based on the evaluation result at least by: determining whether the evaluation result satisfies a malfunction condition; and responsive to determining that the evaluation result satisfies the malfunction condition, determining that a malfunction occurs to the set of onboard sensors. The system where the computer code, when executed by the onboard vehicle computer system, causes the onboard vehicle computer system further to provide a warning message responsive to determining that the malfunction occurs to the set of onboard sensors. The system where: the onboard roadway segment activity data includes first activity data describing sensor data generated by the set of onboard sensors and first configuration data describing a configuration of the set of onboard sensors; and the off-board roadway segment activity data includes second activity data that is aggregated and received from a remote server or generated and received from another connected vehicle and second configuration data associated with the second activity data. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1A:
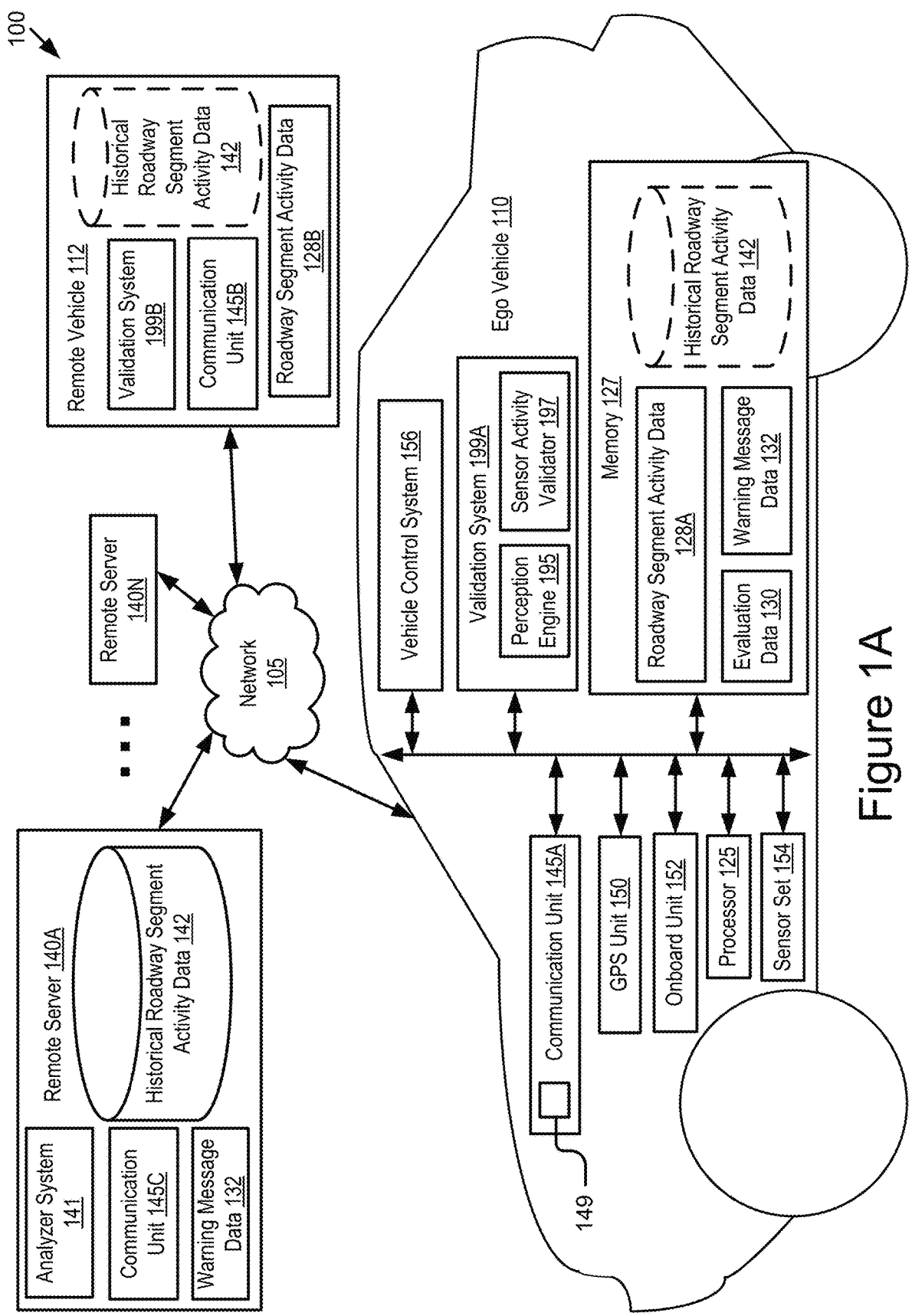
FIG. 1A is a block diagram illustrating an operating environment for a validation system according to some embodiments.

Autonomous driving systems and ADAS systems of vehicles can operate properly based on accurate driving information obtained through onboard sensors (e.g., cameras, radar, LIDAR, etc.) of the vehicles. The driving information related to a particular vehicle may include, but is not limited to, the following: a driving state (e.g., a position, a speed, etc.) of the vehicle; and a surrounding environment where the vehicle is located, etc. There are many reasons that onboard sensors may fail or cease to function properly (e.g., long service life, bug swarms, etc.). Bug swarms are particularly prevalent in rural areas. For example, the onboard sensors may sometimes malfunction due to sensor collection path impairments, uncleanliness, occlusions, system component performance degradations or other example reasons. In order to ensure operation of a vehicle control system that is compliant with a design specification of the vehicle control system, it is beneficial to detect the malfunction of any onboard sensors and take appropriate actions (e.g., notifying drivers and other vehicles of the malfunctioned sensors, modifying an operation of a vehicle control system to ignore inputs from malfunctioning sensors or otherwise account of the impairment in their accuracy) in a timely manner.

Described herein are embodiments of a validation system that is installed in a connected vehicle. The validation system is operable to cause the connected vehicle to wirelessly communicate with one or more other vehicles (or a central remote server) using V2X messages. The validation system determines, based on digital data included in these V2X messages, whether one or more onboard sensors of the connected vehicle fail or continue to function properly.

Existing solutions fail to detect when any one of various types of vehicle sensors does not function properly or yields inaccurate sensor results. An example advantage and improvement provided by the validation system described herein over existing solutions include that the validation system is able to determine when any type of onboard vehicle sensor has failed or is no longer functioning properly. This determination can be performed based on actual sensor measurements. Other example advantages and improvements are also provided by the validation system described herein.

An example overview of the validation system is provided here. In some embodiments, the validation system includes software installed in an onboard unit of a connected vehicle. Assume that two or more vehicles on a roadway include their own instance of the validation system. One connected vehicle is referred to as an "ego vehicle," while another is referred to as a "remote vehicle." The validation systems of the ego vehicle and the remote vehicle cause these connected vehicles to exchange wireless V2X messages with one another. The V2X messages include "roadway segment activity data" as its payload. The roadway segment activity data is described below in more detail.

The validation system of the ego vehicle includes code and routines that are operable, when executed by an onboard unit, to cause the onboard unit to analyze roadway segment activity data. The validation system of the ego vehicle determines whether its onboard sensors are malfunctioning based on an analysis result of the roadway segment activity data.

In some embodiments, the validation system provides its functionality by cooperating with an analyzer system that is installed on a remote server. The remote server may serve as a centralized repository of historical roadway segment activity data that is aggregated from various different remote vehicles over a period of time. The remote server may be a cloud server, an edge server or some other type of server.

The analyzer system includes code and routines that are operable, when executed by a processor of the remote server, to execute operations that help the validation system to provide its functionality. For example, the analyzer system may provide the ego vehicle with historical roadway segment activity data. Then, the ego vehicle uses the historical roadway segment activity data to provide its functionality by comparing the historical roadway segment activity data to its onboard roadway segment activity data recorded by the ego vehicle itself. The historical roadway segment activity data is aggregated based on roadway segment activity data provided to the remote server by one or more remote vehicles. However, the validation system is capable of functioning without a centralized remote server that stores the historical roadway segment activity data. For example, the remote vehicles themselves can store a data structure of such historical data that they then share with the ego vehicle.

As described herein, roadway segment activity data generated by a particular vehicle includes a set of data bits that describe a roadway environment of the particular vehicle. The roadway segment activity data includes digital data that includes two components: (1) activity data; and (2) configuration data. Each instance of activity data is associated with an instance of configuration data.

The activity data includes digital data that describes raw or processed sensor data perceived by onboard sensors of the vehicle. Examples of the processed sensor data include types and positions of perceived road objects (e.g., other vehicles, pedestrians, road obstacles, etc.), and feature data extracted from the raw sensor data, etc.

The configuration data includes digital data that describes a configuration of the sensors of the vehicle (or a configuration of the vehicle) that generates the activity data. Examples of the configuration include a time when the activity data is generated (e.g., a timestamp), a location of the vehicle, an orientation of the vehicle, a sensor model, a sensor measurement resolution, a field of view of a sensor, and a mounting position of the sensor, etc. A further example of the configuration includes one or more processing techniques (e.g., one or more algorithms) used to convert the raw sensor data to the processed sensor data.

In some embodiments, the configuration data enables a comparison of the activity data generated by different vehicles, where each of the vehicles may have different sensor configurations and data processing algorithms. For example, based on respective configuration data associated with the activity data, the activity data generated by different vehicles can be respectively processed by performing one or more converting operations. Example converting operations include one or more of the following: transforming a coordinate system of sensor data that describes a particular sensor measurement to another coordinate system; and down-sampling the sensor data to align its measurement resolution to another measurement resolution. Further example converting operations include assigning a weight to each piece of sensor data based on its expected accuracy, etc. After performing the one or more converting operations, the activity data from the different vehicles can be compared with one another. The comparison of the activity data is further described below with reference to FIG. 2.

Here, from a perspective of a particular vehicle, roadway segment activity data generated by the particular vehicle itself can be referred to as "onboard roadway segment activity data." Roadway segment activity data received from an external source can be referred to as "off-board roadway segment activity data." The external source can be, for example, any other vehicle or a remote server. For example, roadway segment activity data that is generated by any other vehicle and received from the other vehicle can be treated as an example of the off-board roadway segment activity data. In another example, roadway segment activity data that is aggregated by the remote server and received from the remote server can be treated as an example of the off-board roadway segment activity data.

As described herein, examples of V2X communications include, but are not limited to, one or more of the following: Dedicated Short Range Communication (DSRC) (including Basic Safety Messages (BSMs) and Personal Safety Messages (PSMs), among other types of DSRC communication); Long-Term Evolution (LTE); millimeter wave (mmWave) communication; 3G; 4G; 5G; LTE-V2X; 5G-V2X; LTE-Vehicle-to-Vehicle (LTE-V2V); LTE-Device-to-Device (LTE-D2D); Voice over LTE (VoLTE); etc. In some examples, the V2X communications can include V2V communications, Vehicle-to-Infrastructure (V2I) communications, Vehicle-to-Network (V2N) communications or any combination thereof.

Examples of a wireless message (e.g., a V2X message) described herein include, but are not limited to, the following messages: a DSRC message; a BSM message; a LTE message; a LTE-V2X message (e.g., a LTE-V2V message, a LTE-V2I message, a LTE-V2N message, etc.); a 5G-V2X message; and a millimeter wave message, etc.

Example Overview

Referring to FIG. 1A, depicted is an operating environment 100 for a validation system 199 and an analyzer system 141 according to some embodiments. The operating environment 100 may include one or more of the following elements: an ego vehicle 110; a remote vehicle 112; and one or more remote servers 140 (e.g., a remote server 140A, . . . , a remote server 140N). These elements of the operating environment 100 may be communicatively coupled to a network 105. In practice, the operating environment 100 may include any number of ego vehicles 110, remote vehicles 112, remote servers 140 and networks 105.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS) and multimedia messaging service (MMS). In some embodiments, the network 105 further includes networks for hypertext transfer protocol (HTTP), direct data connection, wireless application protocol (WAP), e-mail, DSRC, full-duplex wireless communication and mmWave. In some embodiments, the network 105 further includes networks for WiFi (infrastructure mode), WiFi (ad-hoc mode), visible light communication, TV white space communication and satellite communication. The network 105 may also include a mobile data network that may include 3G, 4G, LTE, LTE-V2X, LTE-D2D, VoLTE, 5G-V2X or any other mobile data network or combination of mobile data networks. Further, the network 105 may include one or more IEEE 802.11 wireless networks.

The ego vehicle 110 may be any type of vehicle. For example, the ego vehicle 110 may include one of the following types of vehicles: a car; a truck; a sports utility vehicle; a bus; a semi-truck; a drone; or any other roadway-based conveyance. The ego vehicle 110 may be a connected vehicle that includes a communication unit and is capable of communicating with other endpoints connected to the network 105.

In some embodiments, the ego vehicle 110 is a DSRC-enabled vehicle which includes a DSRC radio and a DSRC-compliant GPS unit. The ego vehicle 110 may also include other V2X radios besides a DSRC radio. DSRC is not a requirement of embodiments described herein, and any form of V2X communications is also feasible.

The ego vehicle 110 may include one or more of the following elements: a processor 125; a memory 127; a communication unit 145A; a GPS unit 150; an onboard unit 152; a sensor set 154; a vehicle control system 156; and a validation system 199A. These elements of the ego vehicle 110 may be communicatively coupled to one another via a bus.

In some embodiments, the processor 125 and the memory 127 may be elements of an onboard vehicle computer system (such as computer system 200 described below with reference to FIG. 2). The onboard vehicle computer system may be operable to cause or control the operation of the validation system 199A. The onboard vehicle computer system may be operable to access and execute the data stored on the memory 127 to provide the functionality described herein for the validation system 199A or its elements (see, e.g., FIG. 2).

The processor 125 includes an arithmetic logic unit, a microprocessor, a general-purpose controller, or some other processor array to perform computations and provide electronic display signals to a display device. The processor 125 processes data signals and may include various computing architectures. Example computing architectures include a complex instruction set computer (CISC) architecture, a reduced instruction set computer (RISC) architecture, or an architecture implementing a combination of instruction sets. The ego vehicle 110 may include one or more processors 125. Other processors, operating systems, sensors, displays, and physical configurations may be possible.

The memory 127 stores instructions or data that may be executed by the processor 125. The instructions or data may include code for performing the techniques described herein. The memory 127 may be a dynamic random-access memory (DRAM) device, a static random-access memory (SRAM) device, flash memory, or some other memory device. In some embodiments, the memory 127 also includes a non-volatile memory or similar permanent storage device and media. Example permanent storage devices include a hard disk drive, a floppy disk drive, a CD-ROM device, a DVD-ROM device, a DVD-RAM device, a DVD-RW device, and a flash memory device, etc. Additional example permanent storage devices may include some other mass storage device for storing information on a more permanent basis. The ego vehicle 110 may include one or more memories 127.

The memory 127 may store one or more of the following elements: roadway segment activity data 128A; evaluation data 130; and warning message data 132. In some embodiments, the memory 127 may also store historical roadway segment activity data 142.

The roadway segment activity data 128A may include roadway segment activity data generated by the ego vehicle 110 itself. The roadway segment activity data 128A may be onboard roadway segment activity data of the ego vehicle 110.

The evaluation data 130 may include digital data that describes an evaluation result obtained by comparing the roadway segment activity data 128A with off-board roadway segment activity data.

The warning message data 132 may include digital data that describes a warning message. The warning message may be generated responsive to detecting that one or more onboard sensors of the ego vehicle 110 malfunction.

In some embodiments, the historical roadway segment activity data 142 may include instances of roadway segment activity data aggregated by the remote server 140 and sent to the ego vehicle 110 by the remote server 140. In some embodiments, the historical roadway segment activity data 142 may include instances of roadway segment activity data generated by one or more remote vehicles 112 and sent to the ego vehicle 110 by the one or more remote vehicles 112. The historical roadway segment activity data 142 may be treated as off-board roadway segment activity data from a perspective of the ego vehicle 110 because it is received from an external source such as the remote server 140 or remote vehicles 112.

In some embodiments, the GPS unit 150 is a conventional GPS unit of the ego vehicle 110. For example, the GPS unit 150 may include hardware that wirelessly communicates with a GPS satellite to retrieve data that describes a geographic location of the ego vehicle 110. In some embodiments, the GPS unit 150 is a DSRC-compliant GPS unit of the ego vehicle 110. The DSRC-compliant GPS unit is operable to provide GPS data describing the geographic location of the ego vehicle 110 with lane-level accuracy.

The lane-level accuracy indicates that the geographic location of the ego vehicle 110 has an accuracy of plus or minus 1.5 meters of its actual location in the real-world. A lane of a roadway is about 3 meters wide. Thus, an accuracy of plus or minus 1.5 meters is sufficiently precise that it enables other endpoints which receive the location data (via DSRC messages) to know the exact lane of travel of each vehicle on the roadway. The location data can be GPS data that describes the geographic location and the time when the ego vehicle 110 is at this geographic location.

The onboard unit 152 can include one or more processors and one or more memories. For example, the onboard unit 152 includes an electronic control unit (ECU). In some embodiments, the validation system 199A of the ego vehicle 110 is installed on the onboard unit 152.

The sensor set 154 includes one or more sensors that are operable to measure a roadway environment outside of the ego vehicle 110. For example, the sensor set 154 may include one or more sensors that record one or more physical characteristics of the roadway environment that is proximate to the ego vehicle 110. The memory 127 may store sensor data that describes the one or more physical characteristics recorded by the sensor set 154.

In some embodiments, the sensor set 154 may include one or more of the following vehicle sensors: a camera; a LIDAR sensor; a radar sensor; a laser altimeter; an infrared detector; a motion detector; a thermostat; and a sound detector. The sensor set 154 may also include one or more of the following sensors: a carbon monoxide sensor; a carbon dioxide sensor; an oxygen sensor; a mass air flow sensor; and an engine coolant temperature sensor. The sensor set 154 may also include one or more of the following sensors: a throttle position sensor; a crank shaft position sensor; an automobile engine sensor; a valve timer; an air-fuel ratio meter; and a blind spot meter. The sensor set 154 may also include one or more of the following sensors: a curb feeler; a defect detector; a Hall effect sensor, a manifold absolute pressure sensor; a parking sensor; a radar gun; a speedometer; and a speed sensor. The sensor set 154 may also include one or more of the following sensors: a tire-pressure monitoring sensor; a torque sensor; and a transmission fluid temperature sensor. The sensor set 154 may also include one or more of the following sensors: a turbine speed sensor (TSS); a variable reluctance sensor; a vehicle speed sensor (VSS); a water sensor; a wheel speed sensor; and any other type of automotive sensor.

The vehicle control system 156 may include an ADAS system or an autonomous driving system. The ADAS system or the autonomous driving system may provide some or all of the autonomous functionality for the ego vehicle 110. In some embodiments, the vehicle control system 156 may provide the autonomous functionality with aid of sensor measurements provided by the sensor set 154.

The remote vehicle 112 may have a structure similar to that of the ego vehicle 110. Similar description is not repeated here. In some embodiments, the remote vehicle 112 may include an instance of the validation system (e.g., a validation system 199B) and a communication unit 145B. The remote vehicle 112 may also store its own roadway segment activity data 128B and the historical roadway segment activity data 142. The roadway segment activity data 128B may include roadway segment activity data generated by the remote vehicle 112 itself. The roadway segment activity data 128B may be onboard roadway segment activity data of the remote vehicle 112.

The roadway segment activity data 128A and the roadway segment activity data 128B may have a similar structure and may be referred to as "roadway segment activity data 128" individually or collectively.

In some embodiments, the operating environment 100 includes multiple remote vehicles 112. The validation system 199B of each remote vehicle 112 transmits instances of its roadway segment activity data 128B to endpoints such as the remote server 140 and the ego vehicle 110. In some embodiments, the validation system 199B of the remote vehicle 112 includes an instance of the analyzer system 141. This instance of the analyzer system 141 causes the validation system 199B to aggregate the historical roadway segment activity data of the remote vehicle 112 which is then transmitted to the ego vehicle 110. However, in some embodiments, the analyzer system 141 can be installed on the remote server 140 and provides its functionality from that centralized endpoint instead of in each of the individual remote vehicles 112.

The validation systems 199A and 199B may have a similar structure and provide similar functionality. The validation systems 199A and 199B may be referred to herein as "validation system 199," individually or collectively.

In some embodiments, the validation system 199 includes software that is operable, when executed by the processor 125, to cause the processor 125 to execute one or more steps of methods 300-500 described below with reference to FIGS. 3-5B. In some embodiments, the validation system 199 may be implemented using hardware including a field-programmable gate array ("FPGA") or an application-specific integrated circuit ("ASIC"). In some other embodiments, the validation system 199 may be implemented using a combination of hardware and software. The validation system 199 may be stored in a combination of the devices (e.g., servers or other devices), or in one of the devices.

In some embodiments, the validation system 199 includes a perception engine 195 and a sensor activity validator 197. The validation system 199 (including the perception engine 195 and the sensor activity validator 197) is described below in more detail with reference to FIGS. 1B-5B.

The remote server 140 can be an edge server, a cloud server or some other processor-based computing device which is installed in a roadside unit ("RSU") or some other processor-based infrastructure component of a roadway. The roadway includes N remote servers (e.g., the remote server 140A, . . . , the remote server 140N), where N is any positive integer greater than or equal to one. The remote server 140 includes an analyzer system 141 and a communication unit 145C. The remote server 140 may store the warning message data 132 and the historical roadway segment activity data 142.

In some embodiments, the analyzer system 141 receives various roadway segment activity data from various vehicles and aggregates the various roadway segment activity data to be the historical roadway segment activity data 142. The analyzer system 141 stores the historical roadway segment activity data 142 on the remote server 140.

In some embodiments, the analyzer system 141 may be implemented using hardware including an FPGA or an ASIC. In some other embodiments, the analyzer system 141 may be implemented using a combination of hardware and software. The analyzer system 141 may be stored in a combination of the devices (e.g., servers or other devices), or in one of the devices. For example, any combination of remote servers may include instances of the analyzer system 141 so that the functionality of the analyzer system 141 is implemented in a distributed fashion among two or more endpoints connected to the network 105.

The analyzer system 141 is described below in more detail with reference to FIGS. 1B-1C.

The communication units 145A, 145B and 145C may have similar structure and provide similar functionality. The communication units 145A, 145B and 145C may be referred to herein as "communication unit 145," individually or collectively.

The communication unit 145 transmits and receives data to and from the network 105 or to another communication channel. In some embodiments, the communication unit 145 may include a DSRC transceiver, a DSRC receiver and other hardware or software necessary to make the ego vehicle 110, the remote vehicle 112 or the remote server 140 a DSRC-enabled device. For example, the communication unit 145 includes a DSRC antenna configured to broadcast DSRC messages via the network. The DSRC antenna may also transmit BSM messages at a fixed or variable interval (e.g., every 0.1 seconds, at a time interval corresponding to a frequency range from 1.6 Hz to 10 Hz, etc.) that is user configurable.

In some embodiments, the communication unit 145 includes a port for direct physical connection to the network 105 or to another communication channel. For example, the communication unit 145 includes a USB, SD, CAT-5, or similar port for wired communication with the network 105. In some embodiments, the communication unit 145 includes a wireless transceiver for exchanging data with the network 105 or other communication channels using one or more wireless communication methods. Example wireless communication methods may include one or more of the following: IEEE 802.11; and IEEE 802.16, BLUETOOTH®. Example wireless communication methods may further include EN ISO 14906:2004 Electronic Fee Collection—Application interface EN 11253:2004 DSRC—Physical layer using microwave at 5.8 GHz (review). Example wireless communication methods may further include EN 12795:2002 DSRC—DSRC Data link layer: Medium Access and Logical Link Control (review). Example wireless communication methods may further include EN 12834:2002 DSRC—Application layer (review) and EN 13372:2004 DSRC—DSRC profiles for RTTT applications (review). Example wireless communication methods may further include the communication method described in U.S. patent application Ser. No. 14/471,387 filed on Aug. 28, 2014 and entitled "Full-Duplex Coordination System"; or another suitable wireless communication method.

In some embodiments, the communication unit 145 includes a cellular communications transceiver for sending and receiving data over a cellular communications network. For example, the data may be sent or received via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, millimeter wave, DSRC, etc.

The communication unit 145 may include a V2X radio 149. The V2X radio 149 may include a hardware element including a DSRC transmitter which is operable to transmit DSRC messages on the 5.9 GHz band. The 5.9 GHz band is reserved for DSRC messages. The hardware element may also include a DSRC receiver which is operable to receive DSRC messages on the 5.9 GHz band.

Figure 1B:
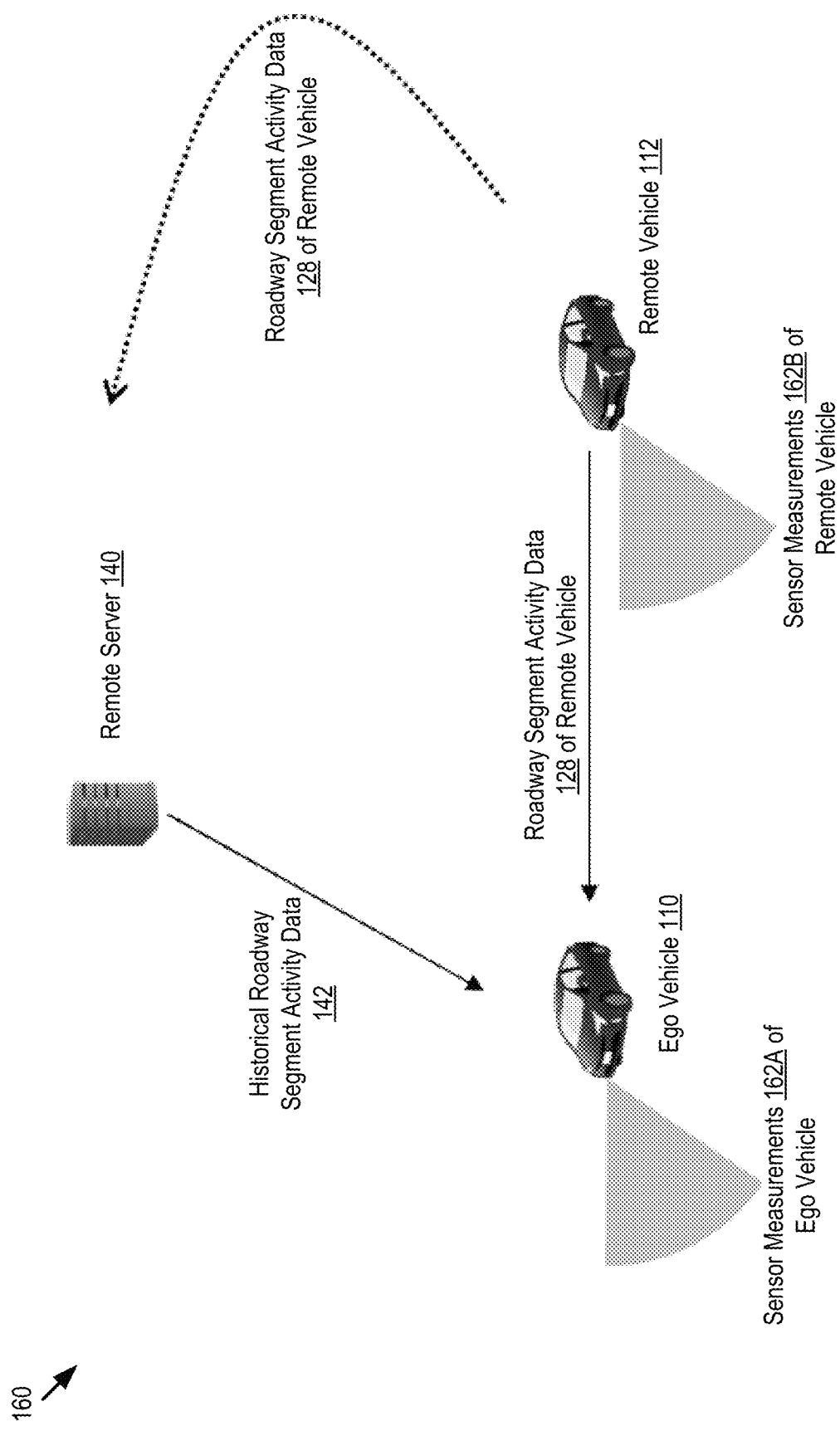
FIG. 1B is a graphical representation illustrating an example architecture for the validation system according to some embodiments.

Referring to FIG. 1B, illustrated is an example architecture 160 for the validation system 199 and the analyzer system 141 according to some embodiments. In FIG. 1B, assume that the ego vehicle 110 and the remote vehicle 112 are present in a same roadway environment. The validation system 199 of the ego vehicle 110 causes the sensor set 154 of the ego vehicle 110 to record sensor data that describes one or more sensor measurements 162A. The validation system 199 of the ego vehicle 110 generates its roadway segment activity data 128 (e.g., onboard roadway segment activity data of the ego vehicle 110) based on the one or more sensor measurements 162A. Similarly, the validation system 199 of the remote vehicle 112 causes the sensor set 154 of the remote vehicle 112 to record sensor data that describes one or more sensor measurements 162B. The validation system 199 of the remote vehicle 112 generates its roadway segment activity data 128 based on the one or more sensor measurements 162B.

In some embodiments, the validation system 199 of the remote vehicle 112 may share its roadway segment activity data 128 with the ego vehicle 110 via a form of V2X communications. Alternatively, or additionally, the validation system 199 of the remote vehicle 112 may upload its roadway segment activity data 128 to the remote server 140. In this way, the remote server 140 may aggregate roadway segment activity data 128 received from various remote vehicles 112 to form the historical roadway segment activity data 142. The historical roadway segment activity data 142 includes aggregated historical roadway segment activity data from the various remote vehicles 112. The remote server 140 may send the historical roadway segment activity data 142 to the ego vehicle 110.

The validation system 199 of the ego vehicle 110 may receive one or more of (1) the roadway segment activity data 128 of the remote vehicle 112 and (2) the historical roadway segment activity data 142, which are off-board roadway segment activity data of the ego vehicle 110.

The validation system 199 of the ego vehicle 110 may routinely or occasionally check a consistency level between its onboard roadway segment activity data and the off-board roadway segment activity data so that an evaluation result is generated. The validation system 199 of the ego vehicle 110 may detect whether any onboard sensor of the ego vehicle 110 malfunctions based on the evaluation result. The consistency level and the evaluation result are described below in more detail.

Figure 1C:
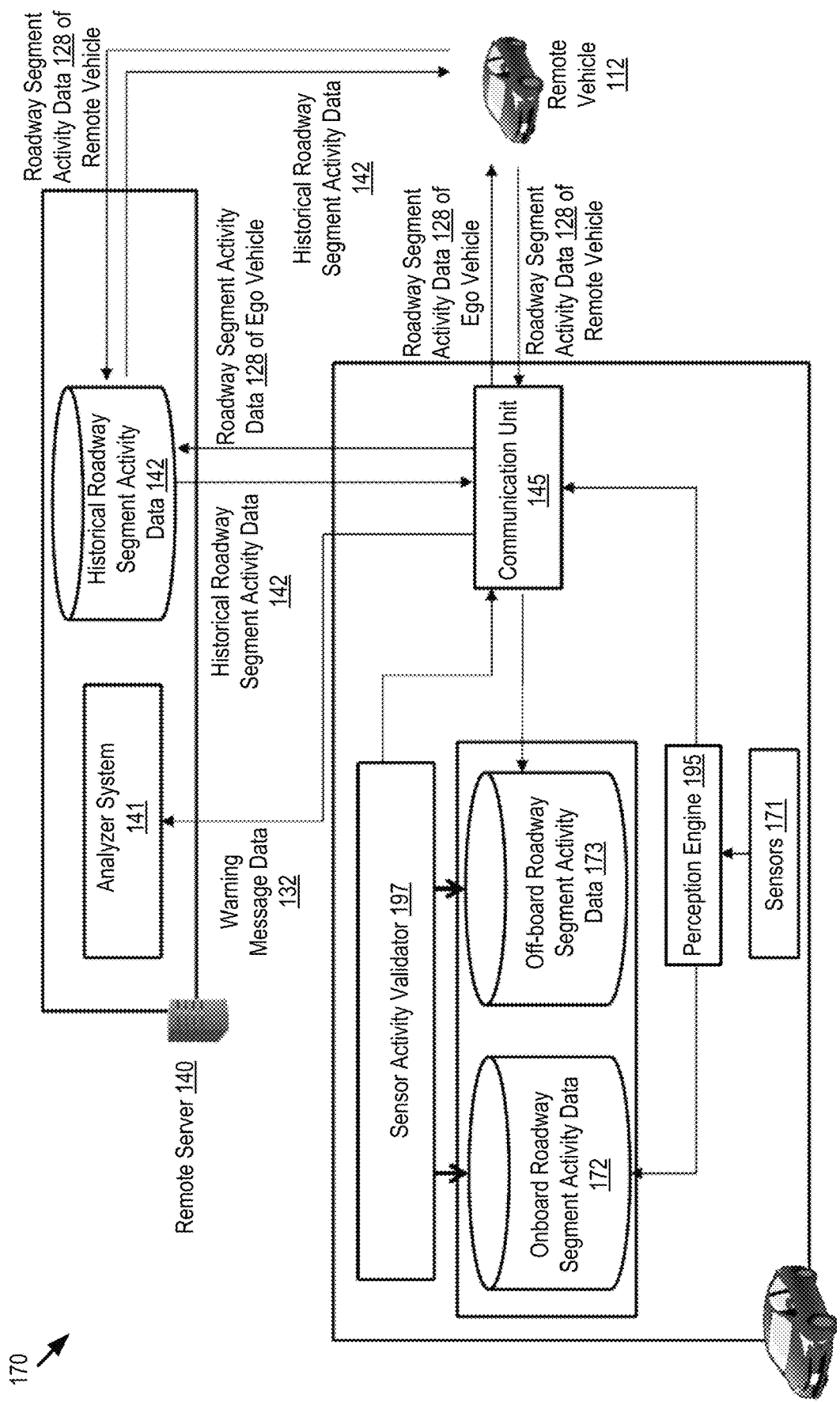
FIG. 1C is a block diagram illustrating another example architecture for the validation system according to some embodiments.

Referring to FIG. 1C, illustrated is another example architecture 170 for the validation system 199 and the analyzer system 141 according to some embodiments. The perception engine 195 installed in the ego vehicle 110 causes sensors 171 of the sensor set 154 to record sensor data that describes one or more sensor measurements. The perception engine 195 generates roadway segment activity data 128 of the ego vehicle 110 based on the one or more sensor measurements. The perception engine 195 stores the roadway segment activity data 128 of the ego vehicle 110 as onboard roadway segment activity data 172. Alternatively, or additionally, the perception engine 195 sends the roadway segment activity data 128 of the ego vehicle 110 to one or more of the remote vehicle 112 and the remote server 140 via the communication unit 145 in a form of a V2X message.

Similarly, the validation system 199 of the remote vehicle 112 generates its own roadway segment activity data 128. In some embodiments, the validation system 199 of the remote vehicle 112 sends its roadway segment activity data 128 to the remote server 140. Alternatively, or additionally, the validation system 199 of the remote vehicle 112 sends its roadway segment activity data 128 to the ego vehicle 110.

In some embodiments, the analyzer system 141 of the remote server 140 may aggregate roadway segment activity data 128 received from various remote vehicles 112 to form the historical roadway segment activity data 142. The historical roadway segment activity data 142 may include aggregated roadway segment activity data for a same roadway environment where the ego vehicle 110 is present. The analyzer system 141 of the remote server 140 may send the historical roadway segment activity data 142 (e.g., the aggregated historical roadway segment activity data) to the ego vehicle 110.

The communication unit 145 of the ego vehicle 110 may receive and store one or more of (1) the roadway segment activity data 128 of the remote vehicle 112 and (2) the historical roadway segment activity data 142 as off-board roadway segment activity data 173.

The sensor activity validator 197 of the ego vehicle 110 may compare the onboard roadway segment activity data 172 with the off-board roadway segment activity data 173 to determine a consistence level between the two. The sensor activity validator 197 may determine an evaluation result based on the consistence level and determine whether a malfunction occurs to any of the sensors 171 based on the evaluation result. The evaluation result is described below in more detail with reference to FIGS. 2 and 5A-5B.

Responsive to detecting that a malfunction occurs to at least one of the sensors 171, the sensor activity validator 197 may generate a warning message describing the malfunction of the at least one sensor. The sensor activity validator 197 sends warning message data 132 describing the warning message to the remote server 140 via the communication unit 145.

Example Computer System

Figure 2:
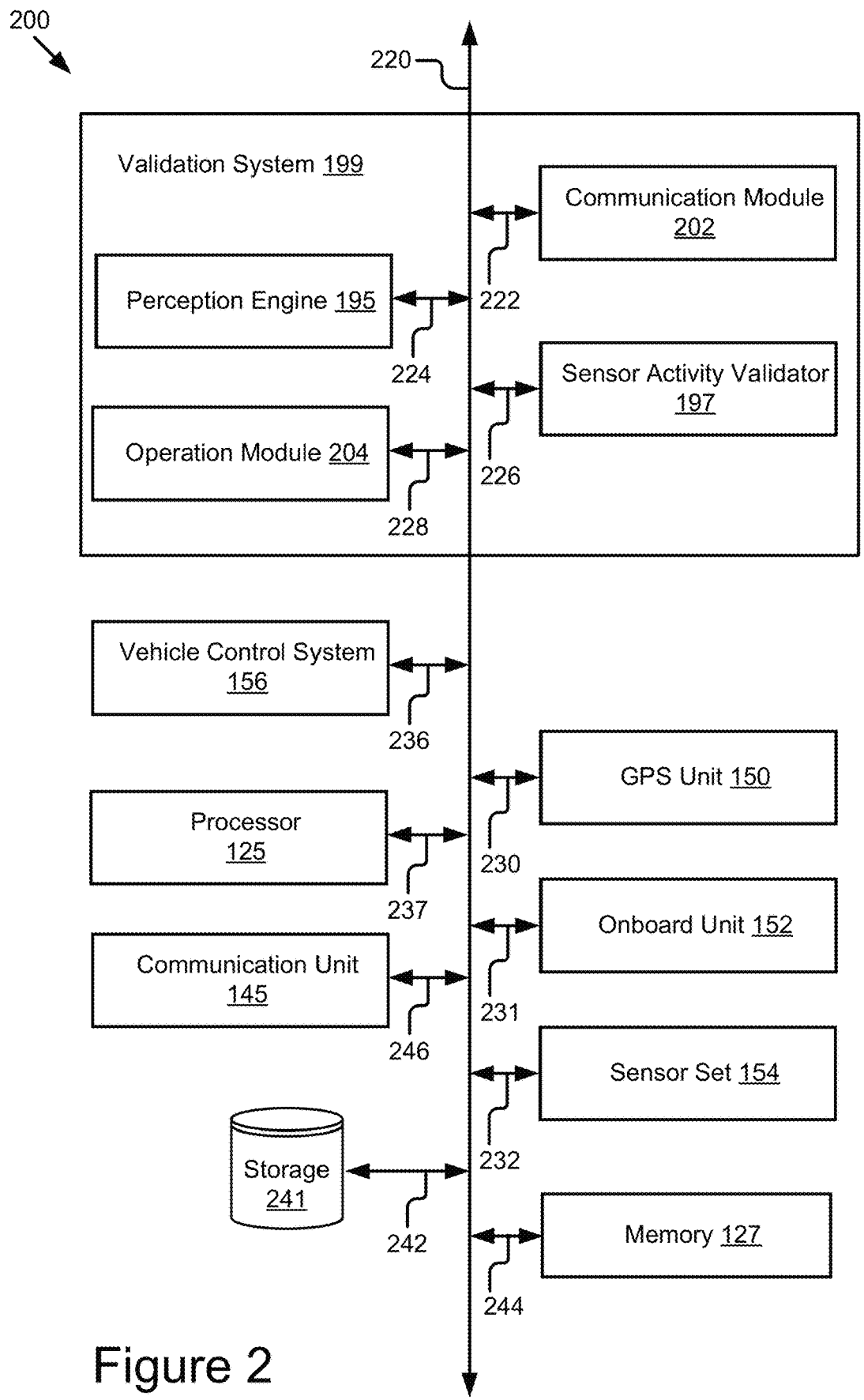
FIG. 2 is a block diagram illustrating an example computer system including the validation system according to some embodiments.

Referring now to FIG. 2, depicted is a block diagram illustrating an example computer system 200 including the validation system 199 according to some embodiments. In some embodiments, the computer system 200 may include a special-purpose computer system that is programmed to perform one or more steps of the methods 300, 400 and 500 described below with reference to FIGS. 3-5B.

In some embodiments, the computer system 200 may be an element of the ego vehicle 110. In some embodiments, the computer system 200 may be an onboard vehicle computer of the ego vehicle 110. In some embodiments, the computer system 200 may include an engine control unit, head unit or some other processor-based computing device of the ego vehicle 110.

The computer system 200 may include one or more of the following elements according to some examples: the validation system 199; the processor 125; and the communication unit 145. The computer system 200 may further include one or more of the following elements: the sensor set 154; the GPS unit 150; the memory 127; the onboard unit 152; the vehicle control system 156; and a storage 241. The components of the computer system 200 are communicatively coupled by a bus 220.

In the illustrated embodiment, the processor 125 is communicatively coupled to the bus 220 via a signal line 237. The communication unit 145 is communicatively coupled to the bus 220 via a signal line 246. The sensor set 154 is communicatively coupled to the bus 220 via a signal line 232. The GPS unit 150 is communicatively coupled to the bus 220 via a signal line 230. The storage 241 is communicatively coupled to the bus 220 via a signal line 242. The memory 127 is communicatively coupled to the bus 220 via a signal line 244. The onboard unit 152 is communicatively coupled to the bus 220 via a signal line 231. The vehicle control system 156 is communicatively coupled to the bus 220 via a signal line 236.

The following elements are described above with reference to FIG. 1A: the processor 125; the communication unit 145; the sensor set 154; the GPS unit 150; the onboard unit 152; the vehicle control system 156; and the memory 127. Those descriptions will not be repeated here.

The storage 241 can be a non-transitory storage medium that stores data for providing the functionality described herein. The storage 241 may be a dynamic random-access memory (DRAM) device, a static random-access memory (SRAM) device, flash memory, or some other memory devices. In some embodiments, the storage 241 also includes a non-volatile memory or similar permanent storage device and media (e.g., a hard disk drive, a floppy disk drive, a flash memory device, etc.) for storing information on a more permanent basis.

In the illustrated embodiment shown in FIG. 2, the validation system 199 includes: a communication module 202; the perception engine 195; the sensor activity validator 197; and an operation module 204. These components of the validation system 199 are communicatively coupled to each other via the bus 220. In some embodiments, components of the validation system 199 can be stored in a single server or device. In some other embodiments, components of the validation system 199 can be distributed and stored across multiple servers or devices.

The communication module 202 can be software including routines for handling communications between the validation system 199 and other components of the computer system 200. In some embodiments, the communication module 202 can be stored in the memory 127 of the computer system 200 and can be accessible and executable by the processor 125. The communication module 202 may be adapted for cooperation and communication with the processor 125 and other components of the computer system 200 via a signal line 222.

The communication module 202 sends and receives data, via the communication unit 145, to and from one or more elements of the operating environment 100. For example, the communication module 202 receives or transmits, via the communication unit 145, a V2X message including roadway segment activity data. The communication module 202 may send or receive any of the data or messages described above with reference to FIGS. 1A-1C via the communication unit 145.

In some embodiments, the communication module 202 receives data from the other components of the validation system 199 and stores the data in one or more of the storage 241 and the memory 127. The other components of the validation system 199 may cause the communication module 202 to communicate with the other elements of the computer system 200 or the operating environment 100 (via the communication unit 145). For example, the perception engine 195 may use the communication module 202 to communicate with the sensor set 154 and cause the sensor set 154 to record sensor data.

The perception engine 195 can be software including routines for generating roadway segment activity data. In some embodiments, the perception engine 195 can be stored in the memory 127 of the computer system 200 and can be accessible and executable by the processor 125. The perception engine 195 may be adapted for cooperation and communication with the processor 125 and other components of the computer system 200 via a signal line 224.

In some embodiments, the perception engine 195 causes sensors of the sensor set 154 to record sensor data that describes one or more sensor measurements. The perception engine 195 generates roadway segment activity data of the ego vehicle 110 based on one or more of: (1) the sensor data recorded by onboard sensors of the ego vehicle 110; and (2) one or more internal system parameters. In some embodiments, the perception engine 195 generates the roadway segment activity data periodically with a particular period of time (e.g., hourly, every two hours, etc.). In some embodiments, the perception engine 195 generates the roadway segment activity data occasionally based on an occurrence of a triggering event of sensor activity validation. For example, the perception engine 195 generates the roadway segment activity data for every 1,000 miles that the ego vehicle 110 travels.

The perception engine 195 may store the generated roadway segment activity data as the onboard roadway segment activity data 172 of the ego vehicle 110 (see, e.g., FIG. 1C). Alternatively, or additionally, the perception engine 195 sends the roadway segment activity data of the ego vehicle 110 to one or more of the remote vehicle 112 and the remote server 140 via the communication unit 145 in a form of a V2X message. The remote vehicle 112 and the remote server 140 may or may not keep the roadway segment activity data of the ego vehicle 110 in their local storage devices.

The sensor activity validator 197 can be software including routines for performing sensor activity validation. In some embodiments, the sensor activity validator 197 can be stored in the memory 127 of the computer system 200 and can be accessible and executable by the processor 125. The sensor activity validator 197 may be adapted for cooperation and communication with the processor 125 and other components of the computer system 200 via a signal line 226.

In some embodiments, the sensor activity validator 197 is operable to perform sensor activity validation based on an occurrence of a triggering event. The triggering event may trigger an execution of the sensor activity validation. For example, the sensor activity validation may be triggered periodically in a particular period of time (e.g., hourly, every two hours, etc.). In another example, the sensor activity validation may be triggered occasionally (e.g., for every certain distance such as 1,000 miles that the ego vehicle 110 travels).

In some embodiments, the sensor activity validator 197 receives, via the communication unit 145, a V2X message that includes off-board roadway segment activity data from an external source. The external source can be, for example, the remote server 140 or the remote vehicle 112. Alternatively, the sensor activity validator 197 retrieves the off-board roadway segment data from a local storage of the ego vehicle 110 (see, e.g., FIG. 1C).

When the sensor activity validation is initiated, the sensor activity validator 197 determines a working status of the set of onboard sensors based on an evaluation between the onboard and off-board roadway segment activity data as described below in more detail.

The working status indicates whether a malfunction occurs to the set of onboard sensors of the ego vehicle 110. For example, the working status indicates that the set of onboard sensors function properly. In another example, the working status indicates that one or more onboard sensors from the set of onboard sensors malfunction. In some embodiments, the working status further indicates one or more of: a type of the malfunction; and an occurrence likelihood of the malfunction. For example, the type of the malfunction can be at least one of: sensor collection path impairments; sensor contamination; sensor uncleanliness; occlusions; and system component performance degradations, etc.

Firstly, the sensor activity validator 197 evaluates the onboard roadway segment activity data and the off-board roadway segment activity data to determine an evaluation result. For example, the sensor activity validator 197 compares the onboard roadway segment activity data with the off-board roadway segment activity data to determine a consistency level between the two. The sensor activity validator 197 generates the evaluation result based on the consistency level.

A detailed example approach to determine the evaluation result is described here. Assume that the onboard roadway segment activity data includes (1) first activity data describing sensor data generated by the set of onboard sensors and (2) first configuration data describing a configuration of the set of onboard sensors. The off-board roadway segment activity data includes (1) second activity data that is aggregated and received from the remote server 140 (or generated and received from the remote vehicle 112) and (2) second configuration data associated with the second activity data.

In this detailed example approach, the sensor activity validator 197 compares the first activity data with the second activity data based on the first configuration data and the second configuration data to determine the consistence level. Specifically, the sensor activity validator 197 performs one or more converting operations on one or more of the first activity data and the second activity data based on the first configuration data and the second configuration data. After performing the one or more converting operations, the sensor activity validator 197 compares the first activity data with the second activity data to determine the consistence level.

For example, assume that a comparison between the first configuration data and the second configuration data indicates that the first activity data has a higher measurement resolution than the second activity data. Then, the sensor activity validator 197 down-samples the first activity data to the measurement resolution of the second activity data, so that the first activity data after the down-sampling can be compared with the second activity data.

In another example, assume that the first configuration data indicates that the first activity data (e.g., describing a location of an object detected by the ego vehicle 110) is measured with reference to a first coordinate system. The second configuration data indicates that the second activity data (e.g., describing a location of the object detected by the remote vehicle 112) is measured with reference to a second coordinate system. The sensor activity validator 197 may transform the first activity data and the second activity data to a common coordinate system (e.g., a reference coordinate system) respectively so that the first activity data the second activity data can be compared with one another.

The consistency level may describe a degree of consistency between the first activity data included in the onboard roadway segment activity data and the second activity data included in the off-board roadway segment activity data. For example, the consistency level indicates that a difference between the first activity data and the second activity data does not exceed a consistency threshold so that the first activity data and the second activity data can be treated as being consistent with one another. In another example, the consistency level indicates that the difference between the first activity data and the second activity data exceeds the consistency threshold so that the first activity data and the second activity data are treated as being inconsistent with one another.

In this detailed example approach, the sensor activity validator 197 determines the evaluation result between the onboard roadway segment activity data and the off-board roadway segment activity data based on the consistency level. For example, if the consistency level indicates that the first activity data is consistent with the second activity data, the sensor activity validator 197 generates an evaluation result that can be used to determine that the set of onboard sensors function properly. In another example, if the consistency level indicates that the first activity data is inconsistent with the second activity data, the sensor activity validator 197 generates an evaluation result that can be used to determine that at least one onboard sensor malfunctions. In yet another example, based on the consistency level, the sensor activity validator 197 generates evaluation data that can be parameterized to compare with an evaluation threshold value for creation of one or more warning messages. The sensor activity validator 197 may also determine other example evaluation results described below with reference to FIGS. 5A-5B.

Next, based on the evaluation result, the sensor activity validator 197 determines the working status of the set of onboard sensors. For example, the sensor activity validator 197 determines whether the evaluation result satisfies a malfunction condition. Responsive to determining that the evaluation result satisfies the malfunction condition, the sensor activity validator 197 determines that a malfunction occurs to the set of onboard sensors. Responsive to determining that the evaluation result does not satisfy any malfunction condition, the sensor activity validator 197 determines that the set of onboard sensors function properly. The malfunction condition may describe a condition under which a malfunction of a sensor occurs. Examples of malfunction conditions are illustrated with reference to FIGS. 5A-5B according to some embodiments. These examples are intended to be illustrative and not exhaustive.

In some examples, the sensor activity validator 197 employs a deterministic decision on whether a malfunction occurs to a certain type of sensor. Alternatively, the sensor activity validator 197 employs a probability representation to present the evaluation result as well as the working status of the sensors (e.g., a presentation with an occurrence likelihood of a certain type of malfunction).

In some embodiments, responsive to determining that the malfunction occurs to at least one of the sensors included in the set of onboard sensors, the sensor activity validator 197 generates and provides a warning message. The warning message may include one or more vehicle visual displays, voice alarms or text alerts. The sensor activity validator 197 may send the warning message to the remote server 140 for further analysis and aggregation at the analyzer system 141 via a form of V2X communications. The sensor activity validator 197 may also send the warning message to the remote vehicle 112.

In some embodiments, after detecting a malfunctioned sensor (e.g., a faulty sensor) of the ego vehicle 110, the sensor activity validator 197 may suppress providing the sensor data of the ego vehicle 110 (via a cooperative awareness message) to other vehicles. The sensor activity validator 197 may send a warning message to explicitly warn the other vehicles regarding the faulty perception of the malfunctioned sensor. Alternatively, or additionally, the sensor activity validator 197 may send a warning message along with cooperative awareness messages with lowered confidence levels.

The operation module 204 can be software including routines for modifying an operation of the vehicle control system 156 based on the working status of the set of onboard sensors of the ego vehicle 110. In some embodiments, the operation module 204 can be stored in the memory 127 of the computer system 200 and can be accessible and executable by the processor 125. The operation module 204 may be adapted for cooperation and communication with the processor 125 and other components of the computer system 200 via a signal line 228.

In some embodiments, the operation module 204 may modify an operation of the vehicle control system 156 of the ego vehicle 110 based on the working status of the set of onboard sensors to ensure that the vehicle control system (e.g., ADAS system or autonomous driving system) of the ego vehicle 110 operates in compliance with a design specification of the vehicle control system. For example, assume that the ego vehicle 110 intends to change to a right lane. A first camera of the ego vehicle 110 detects a measurement result indicating that a remote vehicle is traveling on the right lane behind the ego vehicle 110. A second camera of the ego vehicle 110 detects a second measurement result indicating that no vehicle is traveling on the right lane behind the ego vehicle 110. Because the second camera is detected to be malfunctioned, the second measurement result of the second camera may be ignored by an ADAS system or an autonomous driving system of the ego vehicle 110. The ADAS system or the autonomous driving system of the ego vehicle 110 may control an operation of the ego vehicle 110 to stop the changing to the right lane based on the first measurement result of the first camera.

Example Processes

Figure 3:
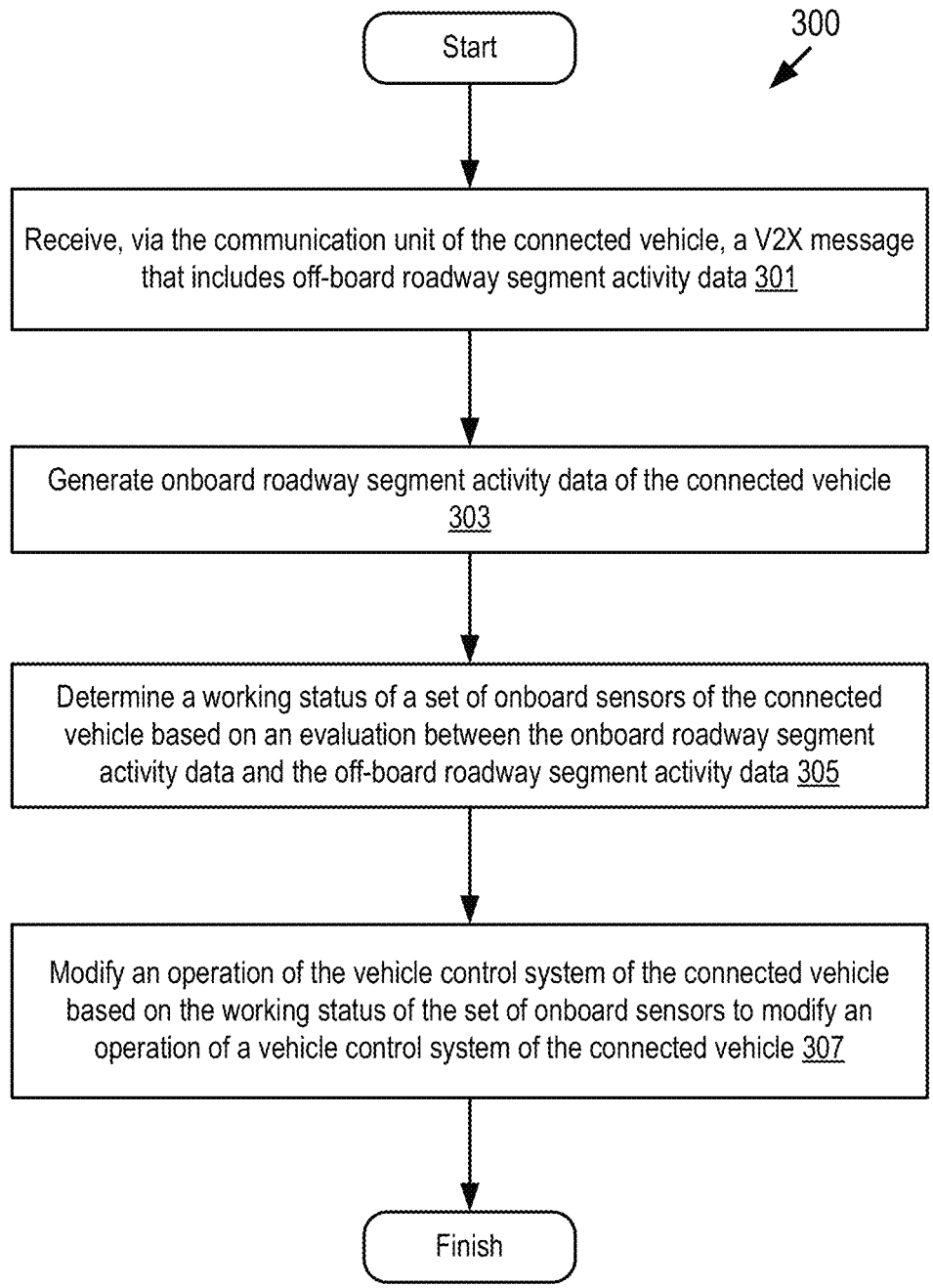
FIG. 3 depicts a method for determining a working status of a set of sensors onboard in a connected vehicle through a validation of roadway segment activity data according to some embodiments.

Referring now to FIG. 3, depicted is a flowchart of an example method 300 for determining a working status of a set of sensors onboard in a connected vehicle (e.g., the ego vehicle 110) through a validation of roadway segment activity data according to some embodiments. The steps of the method 300 are executable in any order, and not necessarily the order depicted in FIG. 3.

At step 301, the sensor activity validator 197 receives, via the communication unit 145 of the connected vehicle, a V2X message that includes off-board roadway segment activity data.

At step 303, the perception engine 195 generates onboard roadway segment activity data of the connected vehicle.

At step 305, the sensor activity validator 197 determines a working status of a set of onboard sensors of the connected vehicle based on an evaluation between the onboard roadway segment activity data and the off-board roadway segment activity data.

At step 307, the operation module 204 modifies an operation of the vehicle control system of the connected vehicle based on the working status of the set of onboard sensors to ensure that the vehicle control system operations in compliance with its design specification. In some embodiments, a design specification for a vehicle control system is described by digital data (e.g., design data). In some embodiments, the design specification for a vehicle control system describes how a vehicle control system should respond or operate responsive to a past, present, future state of the connected vehicle that includes the vehicle control system as a component. The state of the connected vehicle may include, among other things, the operating environment of the connected vehicle as described by the sensor data which is recorded by one or more of the following: onboard sensors of the connected vehicle; and off-board sensors which are elements of other devices such as remote connected vehicles that provide their sensor data via V2X communications with the connected vehicle. In some embodiments, a memory of a connected vehicle stores the design data for the vehicle control system of the connected vehicle. In some embodiments, the design data is analyzed to determine how to modify an operation of the vehicle control system responsive to a working status of the set of onboard sensors.

Figure 4:
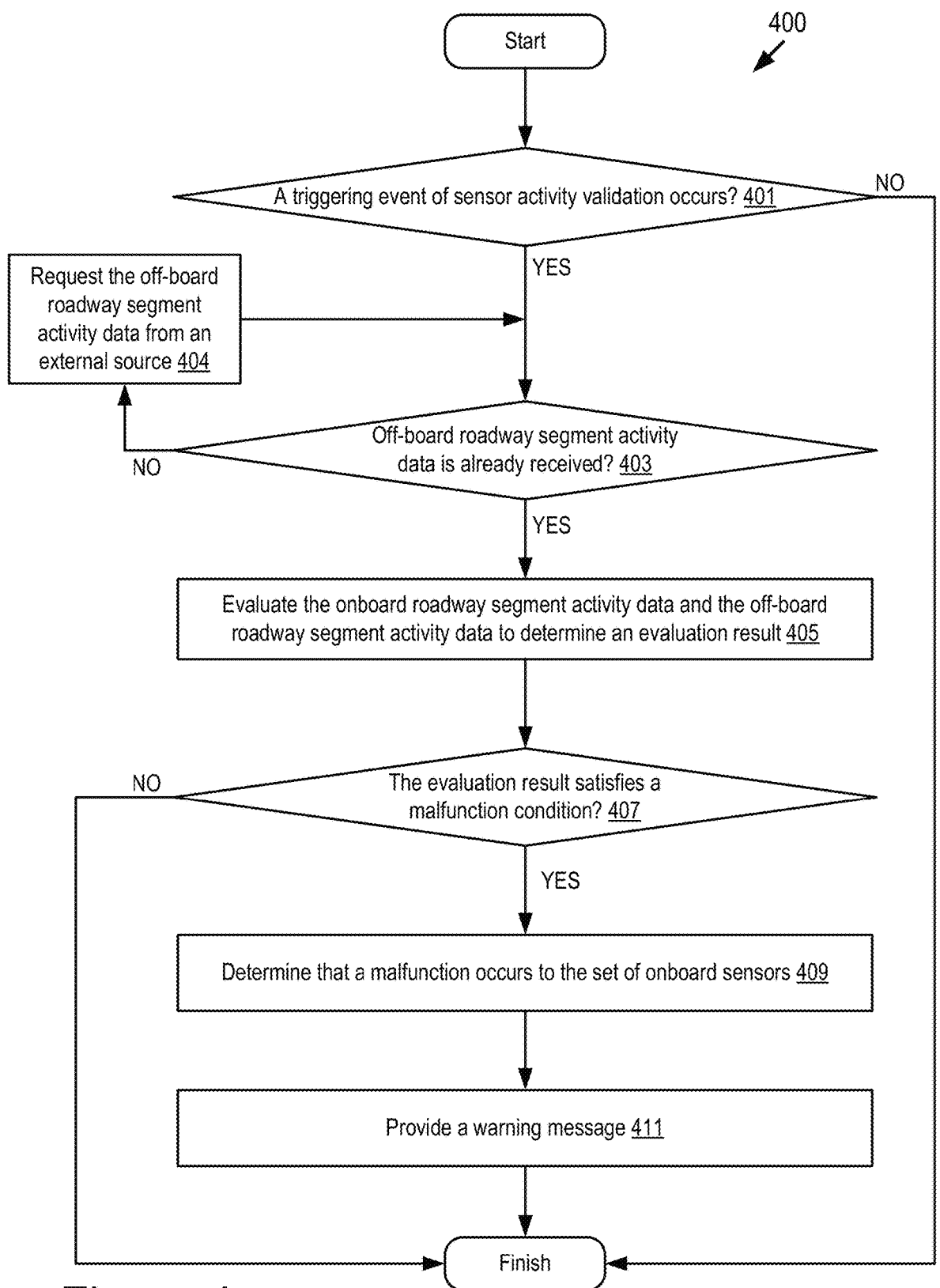
FIG. 4 depicts another method for determining a working status of a set of sensors onboard in a connected vehicle through a validation of roadway segment activity data according to some embodiments.

FIG. 4 depicts another method 400 for determining a working status of a set of sensors onboard in a connected vehicle through a validation of roadway segment activity data according to some embodiments. The steps of the method 400 are executable in any order, and not necessarily the order depicted in FIG. 4.

At step 401, the sensor activity validator 197 determines whether a triggering event of sensor activity validation occurs. Responsive to an occurrence of the triggering event, the method 400 moves to step 403. Otherwise, the method 400 ends.

At step 403, the sensor activity validator 197 determines whether off-board roadway segment activity data is already received. Responsive to determining that the off-board roadway segment activity data is received, the method 400 moves to step 405. Otherwise, the method 400 moves to step 404.

At step 404, the sensor activity validator 197 requests the off-board roadway segment activity data from an external source.

At step 405, the sensor activity validator 197 evaluates the onboard roadway segment activity data and the off-board roadway segment activity data to determine an evaluation result.

At step 407, the sensor activity validator 197 determines whether the evaluation result satisfies a malfunction condition. Responsive to the evaluation result satisfying the malfunction condition, the method 400 moves to step 409. Otherwise, the sensor activity validator 197 determines that no malfunction occurs to the sensors, and the method 400 ends.

At step 409, the sensor activity validator 197 determines that a malfunction occurs to the set of onboard sensors of the connected vehicle.

At step 411, the sensor activity validator 197 provides a warning message responsive to determining that the malfunction occurs to the set of onboard sensors.

Figure 5A:
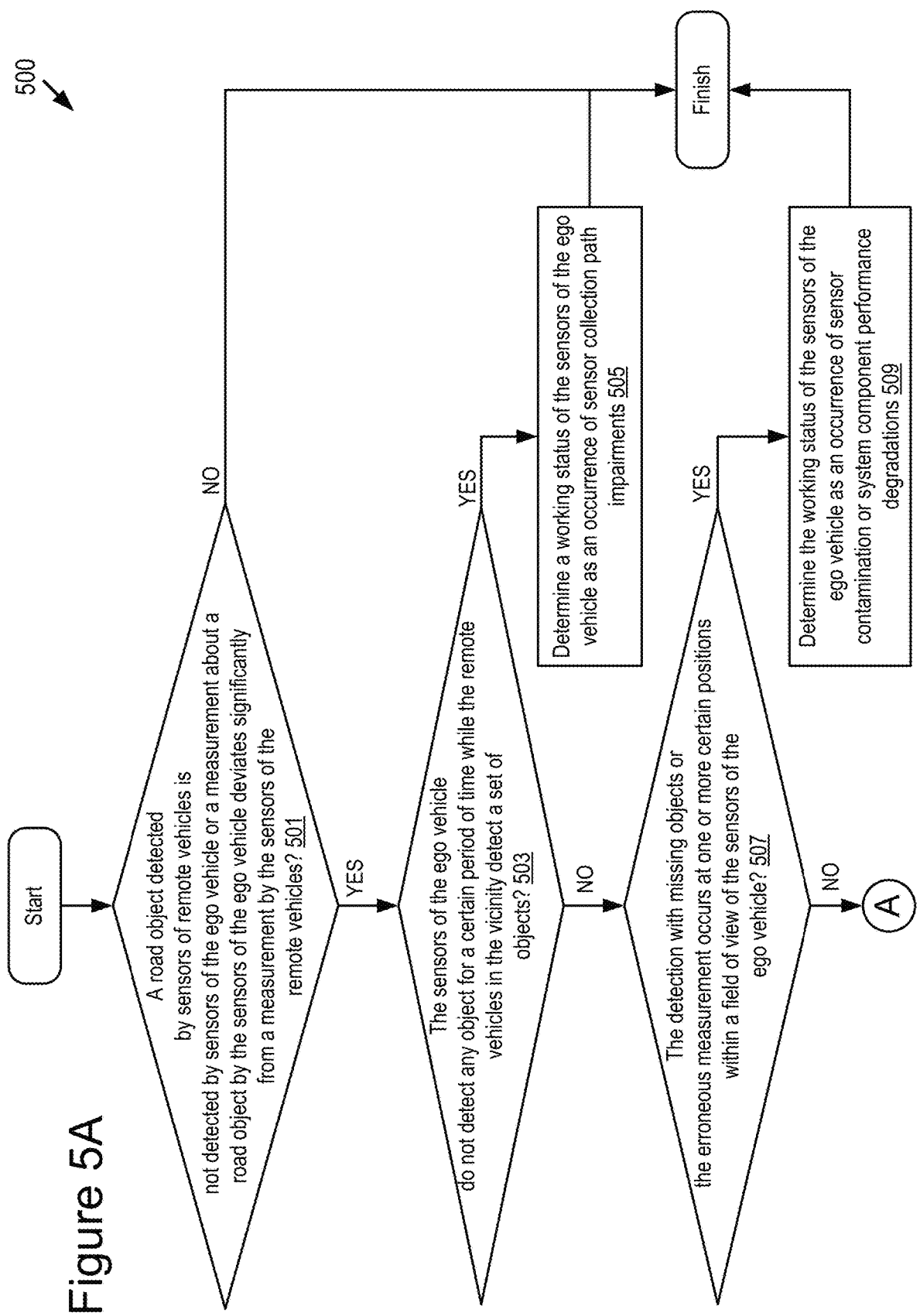
FIGS. 5A-5B depict a method for determining a working status of a set of sensors onboard in a connected vehicle based on an evaluation result according to some embodiments.
Figure 5B:
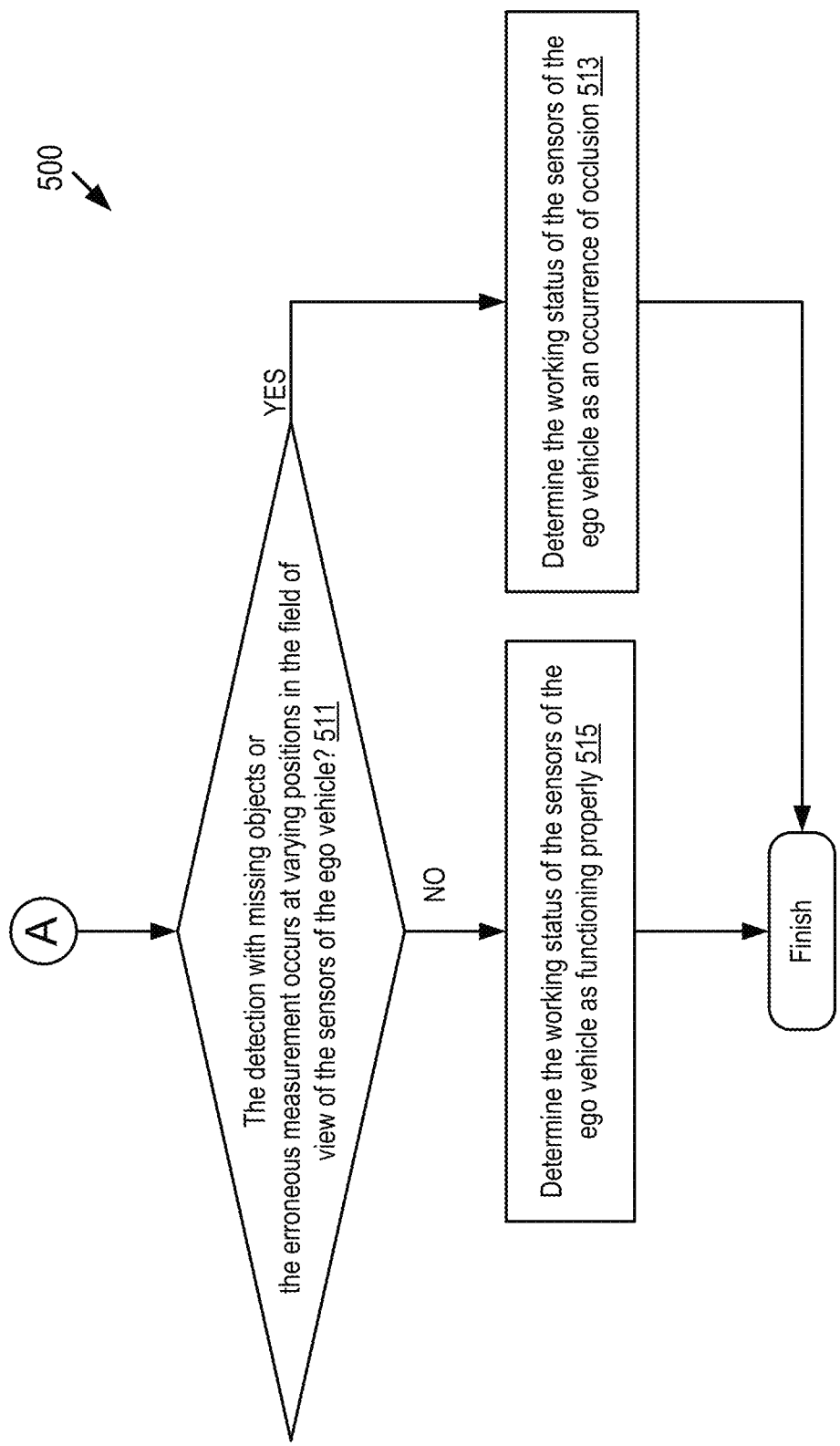

FIGS. 5A-5B depict a method 500 for determining a working status of a set of sensors onboard in a connected vehicle based on an evaluation result according to some embodiments. The steps of the method 500 are executable in any order, and not necessarily the order depicted in FIGS. 5A-5B.

Referring to FIG. 5A, at step 501, the sensor activity validator 197 determines whether the evaluation result indicates that a road object detected by sensors of remote vehicles 112 is not detected by sensors of the ego vehicle 110. Responsive to the road object detected by sensors of the remote vehicles 112 being not detected by sensors of the ego vehicle 110 (e.g., a detection with missing objects by the ego vehicle 110), the method 500 moves to step 503. Or, the sensor activity validator 197 determines whether the evaluation result indicates that a measurement about a road object by the sensors of the ego vehicle 110 deviates significantly from a measurement by the sensors of the remote vehicles 112. Responsive to the measurement about the road object by the sensors of the ego vehicle 110 deviates significantly from the measurement by the sensors of the remote vehicles 112 (e.g., an erroneous measurement by the ego vehicle 110), the method 500 moves to step 503. Otherwise, the sensor activity validator 197 determines the working status of the sensors of the ego vehicle 110 as functioning properly, and the method 500 ends.

At step 503, the sensor activity validator 197 determines whether the evaluation result further indicates that the sensors of the ego vehicle 110 do not detect any object for a certain period of time while the remote vehicles 112 in the vicinity detect a set of objects. Responsive to the sensors of the ego vehicle 110 detecting no object for the certain period of time while the remote vehicles 112 in the vicinity detect a set of objects, the method 500 moves to step 505. Otherwise, the method 500 moves to step 507.

At step 505, the sensor activity validator 197 determines the working status of the sensors of the ego vehicle 110 as an occurrence of sensor collection path impairments.

At step 507, the sensor activity validator 197 determines whether the evaluation result indicates that the detection with missing objects or the erroneous measurement occurs at one or more certain positions within a field of view of the sensors of the ego vehicle 110. Responsive to the detection with missing objects or the erroneous measurement occurring at one or more certain positions within the field of view of the sensors of the ego vehicle 110, the method 500 moves to step 509. Otherwise, the method 500 moves to step 511.

At step 509, the sensor activity validator 197 determines the working status of the sensors of the ego vehicle 110 as an occurrence of sensor contamination or system component performance degradations.

Referring to FIG. 5B, the sensor activity validator 197 determines whether the evaluation result indicates that the detection with missing objects or the erroneous measurement occurs at varying positions in the field of view of the sensors of the ego vehicle 110. Responsive to the detection with missing objects or the erroneous measurement occurring at varying positions in the field of view of the sensors of the ego vehicle 110, the method 500 moves to step 513. Otherwise, the method 500 moves to step 515.

At step 513, the sensor activity validator 197 determines the working status of the sensors of the ego vehicle 110 as an occurrence of occlusion.

At step 515, the sensor activity validator 197 determines the working status of the sensors of the ego vehicle 110 as functioning properly.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A computer program product comprising a non-transitory memory of an onboard vehicle computer system of a connected vehicle storing computer-executable code that, when executed by a processor, causes the processor to:
receive, via a communication unit of the connected vehicle, a Vehicle-to-Everything (V2X) message that includes off-board roadway segment activity data from an external source;
generate onboard roadway segment activity data of the connected vehicle;
evaluate the onboard roadway segment activity data and the off-board roadway segment activity data to determine an evaluation result;
determine a working status of a set of onboard sensors of the connected vehicle based on the evaluation result, wherein the working status indicates whether a malfunction occurs to the set of onboard sensors; and
modify an operation of a vehicle control system of the connected vehicle based on the working status of the set of onboard sensors by determining to not send sensor data from the connected vehicle to other vehicles or sending the sensor data with a lowered confidence level to the other vehicles.

2. The computer program product of claim 1, wherein the computer-executable code, when executed by the processor, causes the processor to evaluate the onboard roadway segment activity data and the off-board roadway segment activity data to determine the evaluation result at least by:
transforming the onboard roadway segment activity data and the off-board roadway segment activity data to a common coordinate system;
comparing the onboard roadway segment activity data with the off-board roadway segment activity data to determine a consistency level; and
generating the evaluation result based on the consistency level.

3. The computer program product of claim 1, wherein the computer-executable code, when executed by the processor, causes the processor to determine the working status of the set of onboard sensors of the connected vehicle based on the evaluation result at least by:
determining whether the evaluation result satisfies a malfunction condition; and
responsive to determining that the evaluation result satisfies the malfunction condition, determining that the malfunction occurs to the set of onboard sensors and an occurrence likelihood of a type of malfunction.

4. The computer program product of claim 1, wherein the onboard roadway segment activity data includes activity data describing sensor data generated by the set of onboard sensors and configuration data describing a configuration of the set of onboard sensors.

5. A method for a connected vehicle, comprising:
receiving, via a communication unit of the connected vehicle, a Vehicle-to-Everything (V2X) message that includes off-board roadway segment activity data;
generating onboard roadway segment activity data of the connected vehicle;
determining a working status of a set of onboard sensors of the connected vehicle based on an evaluation between the onboard roadway segment activity data and the off-board roadway segment activity data; and
modifying an operation of a vehicle control system of the connected vehicle based on the working status of the set of onboard sensors by determining to not send sensor data from the connected vehicle to other vehicles or sending the sensor data with a lowered confidence level to the other vehicles.

6. The method of claim 5, wherein the working status indicates whether a malfunction occurs to the set of onboard sensors of the connected vehicle.

7. The method of claim 6, wherein the working status further indicates one or more of: a type of the malfunction or an occurrence likelihood of the malfunction.

8. The method of claim 5, wherein determining the working status of the set of onboard sensors of the connected vehicle comprises:
evaluating the onboard roadway segment activity data and the off-board roadway segment activity data to determine an evaluation result; and
determining the working status of the set of onboard sensors based on the evaluation result.

9. The method of claim 8, wherein evaluating the onboard roadway segment activity data and the off-board roadway segment activity data to determine the evaluation result comprises:
transforming the onboard roadway segment activity data and the off-board roadway segment activity data to a common coordinate system;
comparing the onboard roadway segment activity data with the off-board roadway segment activity data to determine a consistency level; and
generating the evaluation result based on the consistency level.

10. The method of claim 8, wherein determining the working status of the set of onboard sensors based on the evaluation result comprises:
determining whether the evaluation result satisfies a malfunction condition; and
responsive to determining that the evaluation result satisfies the malfunction condition, determining that a malfunction occurs to the set of onboard sensors.

11. The method of claim 10, further comprising:
responsive to determining that the malfunction occurs to the set of onboard sensors, providing a warning message to a remote server that describes the malfunction.

12. The method of claim 5, wherein:
the onboard roadway segment activity data includes first activity data describing sensor data generated by the set of onboard sensors and first configuration data describing a configuration of the set of onboard sensors; and
the off-board roadway segment activity data includes second activity data that is aggregated and received from a remote server or generated and received from another connected vehicle and second configuration data associated with the second activity data.

13. A system comprising:
an onboard vehicle computer system of a connected vehicle including a non-transitory memory storing computer code which, when executed by the onboard vehicle computer system, causes the onboard vehicle computer system to:
receive, via a communication unit of the connected vehicle, a Vehicle-to-Everything (V2X) message that includes off-board roadway segment activity data;
generate onboard roadway segment activity data of the connected vehicle;
determine a working status of a set of onboard sensors of the connected vehicle based on an evaluation between the onboard roadway segment activity data and the off-board roadway segment activity data; and
modify an operation of a vehicle control system of the connected vehicle based on the working status of the set of onboard sensors by determining to not send sensor data from the connected vehicle to other vehicles or sending the sensor data with a lowered confidence level to the other vehicles.

14. The system of claim 13, wherein the working status indicates whether a malfunction occurs to the set of onboard sensors of the connected vehicle.

15. The system of claim 14, wherein the working status further indicates one or more of: a type of the malfunction or an occurrence likelihood of the malfunction.

16. The system of claim 13, wherein the computer code, when executed by the onboard vehicle computer system, causes the onboard vehicle computer system to determine the working status of the set of onboard sensors of the connected vehicle at least by:

evaluating the onboard roadway segment activity data and the off-board roadway segment activity data to determine an evaluation result; and determining the working status of the set of onboard sensors based on the evaluation result.

17. The system of claim 16, wherein the computer code, when executed by the onboard vehicle computer system, causes the onboard vehicle computer system to evaluate the onboard roadway segment activity data and the off-board roadway segment activity data to determine the evaluation result at least by:

transforming the onboard roadway segment activity data and the off-board roadway segment activity data to a common coordinate system;

comparing the onboard roadway segment activity data with the off-board roadway segment activity data to determine a consistency level; and generating the evaluation result based on the consistency level.

18. The system of claim 16, wherein the computer code, when executed by the onboard vehicle computer system, causes the onboard vehicle computer system to determine the working status of the set of onboard sensors based on the evaluation result at least by:

determining whether the evaluation result satisfies a malfunction condition; and responsive to determining that the evaluation result satisfies the malfunction condition, determining that a malfunction occurs to the set of onboard sensors.

19. The system of claim 18, wherein the computer code, when executed by the onboard vehicle computer system, causes the onboard vehicle computer system further to:

responsive to determining that the malfunction occurs to the set of onboard sensors, provide a warning message to a remote server that describes the malfunction.

20. The system of claim 13, wherein:

the onboard roadway segment activity data includes first activity data describing sensor data generated by the set of onboard sensors and first configuration data describing a configuration of the set of onboard sensors; and the off-board roadway segment activity data includes second activity data that is aggregated and received from a remote server or generated and received from another connected vehicle and second configuration data associated with the second activity data.

* * * * *